United States Patent
Koh et al.

(10) Patent No.: US 7,489,743 B2
(45) Date of Patent: Feb. 10, 2009

(54) RECOVERY CIRCUITS AND METHODS FOR THE SAME

(75) Inventors: Hwa Su Koh, Seongnam-si (KR); Ki Mio Ueda, Seoul (KR); Duck Hyun Chang, Seongnam-si (KR); Nyun Tae Kim, Yongin-si (KR); Dae Seung Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 595 days.

(21) Appl. No.: 11/179,558

(22) Filed: Jul. 13, 2005

(65) Prior Publication Data
US 2006/0013349 A1   Jan. 19, 2006

(30) Foreign Application Priority Data
Jul. 14, 2004   (KR) ...................... 10-2004-0054824

(51) Int. Cl.
    H03D 3/18   (2006.01)
(52) U.S. Cl. ...................................................... 375/327
(58) Field of Classification Search ................. 375/215, 375/294, 327, 376; 342/103; 370/503; 455/180.3, 455/266
    See application file for complete search history.

(56) References Cited

U.S. PATENT DOCUMENTS

| 6,586,977 | B2 | 7/2003 | Yang et al. |
| 6,683,930 | B1 | 1/2004 | Dalmia |
| 2002/0097073 | A1* | 7/2002 | Yang et al. .................. 327/158 |
| 2002/0125960 | A1 | 9/2002 | Pickering |
| 2003/0012301 | A1* | 1/2003 | Walker ....................... 375/305 |

FOREIGN PATENT DOCUMENTS

KR    2002-0046482    6/2002

* cited by examiner

*Primary Examiner*—Sam K Ahn
(74) *Attorney, Agent, or Firm*—Harness, Dickey & Pierce, P.L.C.

(57) ABSTRACT

A recovery circuit may include a phase detector, a quadrant decision unit, a quadrant controller, a charge pump unit, and a phase interpolator. The phase detector may compare a phase of input data with a phase of a current output clock to generate first up signal and first down signal and the quadrant decision unit may determine the phase location for the current output clock and output quadrant decision signals based on a phase location. The quadrant controller may output a second up signal and a second down signal based on the first up signal and the first down signal and the quadrant decision signals, and the charge pump unit may output a first and second phase control voltage based on the second up signal and the second down signal. The phase interpolator may select clocks from a plurality of clocks based on the quadrant decision signals and output an output clock signal based on the selected clocks.

29 Claims, 10 Drawing Sheets

FIG. 7

| CURRENT QUADRANT | CURRENT STATE OF I,Q | | BOUNDARY | UPDATED QUADRANT | UPDATED STATE OF I,Q | |
|---|---|---|---|---|---|---|
| | I | Q | | | I | Q |
| 1 | H | H | Vmax | 4 | H | L |
| | | | Vmin | 2 | L | H |
| 2 | L | H | Vmax | 3 | L | L |
| | | | Vmin | 1 | H | H |
| 3 | L | L | Vmax | 2 | L | H |
| | | | Vmin | 4 | H | L |
| 4 | H | L | Vmax | 1 | H | H |
| | | | Vmin | 3 | L | L |

RECOVERY CIRCUITS AND METHODS FOR THE SAME

PRIORITY STATEMENT

This non-provisional U.S. application claims priority under 35 U.S.C. §119 to Korean Patent Application No. 2004-0054824 filed on Jul. 14, 2004 in the Korean Intellectual Property Office (KIPO), the entire contents of which are hereby incorporated by reference.

BACKGROUND

1. Field of the Invention

Example embodiments of the present invention relate to recovery circuits (e.g., clock and/or data recovery circuits) and methods for the same.

2. Description of the Conventional Art

Serial transmission of digital data between remote devices may, for example, reduce costs associated with wiring and/or suppress noise (e.g., cross-talk noise). For example, serial data transmission may allow an optical fiber, a coaxial cable or a twisted-pair cable to carry a serial stream of data bits at a higher speed than, for example, a parallel data transmission.

In conventional asynchronous communication, communication systems data may transmit data without a separate clock signal. If a separate clock signal is not used at a receiver side of communication systems, a clock recovery circuit (CRC) may be used to extract clock information from incoming data signals. Once clock information is extracted, the recovered clock may be used to re-time and regenerate the original data.

FIG. 1 is a block diagram illustrating a conventional clock recovery circuit using a phase locked loop (PLL). In the conventional clock recovery circuit (of FIG. 1), a multiplexer 120 may receive an input reference frequency clock 110 and serial data 100. The reference frequency clock 110 may be produced by a crystal oscillator, and may be a lower, or relatively lower, frequency clock.

The reference frequency clock 110 provided to the multiplexer 120 may be output as a higher frequency clock, for example, after passing through a feedback loop formed by a frequency phase detector 130, a loop filter 140, a voltage-controlled oscillator (VCO) 150, and a frequency divider 160.

For example, if the required frequency is about 2.00 GHz, 2.00 GHz of clock may be generated using a crystal oscillator having an oscillating frequency of 25 MHz and a frequency divider 160 having a division ratio of 80.

When the oscillated clock reaches about 2.00 GHz, serial input data 100, instead of the reference frequency clock 110, may be input to the phase locked loop (PLL) through the multiplexer 120, and a clock 180 synchronized to the serial input data 100, may be output. The clock 180, along with the serial input data 100, may be applied to a flip-flop 170 and a re-synchronized clock data 190 may be output.

A phase locked loop (PLL) may provide clock data synchronized to the higher-rate serial input data 100 in a reduced amount of time, for example, when the serial input data 100 contains jitter. Performance of the clock recovery circuit may depend on the performance of a phase locked loop (PLL), which may have a larger amount of power dissipation, larger chip area, design difficulty and/or noise.

Phase interpolation may be used to generate a clock having phase ranges between the phases of two input clocks, which have phases different from each other. For example, a clock having a phase in the range of 0-90 degrees may be generated using a clock having 0 degree phase and another clock having 90 degree phase.

A phase interpolator may be categorized into a digital phase interpolator and an analog phase interpolator. The digital phase interpolator may include multiple-staged delay element serially coupled each other. Each stage of the delay elements may have a delay different from another, and each delay element may output a different phase. The digital phase interpolator may obtain interpolated phases through a multiplexer that multiplexes the different phases output from each stage of the delay elements. Alternatively, the interpolated phases may be obtained by blending the different phases output from each stage of the delay elements.

FIG. 2 is a block diagram illustrating another conventional clock recovery circuit employing an analog phase interpolator.

Referring to FIG. 2, a phase detector 210 may generate a phase difference signal based on a phase comparison between serial input data 205 and an output clock 280. When a phase of the serial input data 205 leads a phase of the output clock 280, the phase detector 210 may generate a PDup having a high logic level and a $PD_{dn}$ having a low logic level. If a phase of the output clock 280 leads a phase of the serial input data 205, the phase detector 210 may generate a $PD_{up}$ having a low logic level and a $PD_{dn}$ having a high logic level. The $PD_{up}$ and $PD_{dn}$ signals output from the phase detector 210 may be input to a quadrant controller 220, and the quadrant controller 220 may determine a phase location of a phase of the output clock 280.

In this example, the first quadrant may have a phase range of 0-90 degrees, the second quadrant may have a phase range of 90-180 degrees, the third quadrant may have the phase range of 180-270 degrees and the fourth quadrant may have a phase range of 270-360 degrees. The quadrant controller 220 may map the $PD_{up}$ and $PD_{dn}$ signals to input signals $A_{up}$, $A_{dn}$, $B_{up}$ and $B_{dn}$ of an amplitude controller 230.

The amplitude controller 230 may map the input signals $A_{up}$, $A_{dn}$, $B_{up}$ and $B_{dn}$ to input signals $I_{up}$, $I_{dn}$, $Q_{up}$ and $Q_{dn}$ of charge pump circuits 240 and 250. The amplitude controller 230 may control $I_{up}$, $I_{dn}$, $Q_{up}$ and $Q_{dn}$ such that voltage control signals VA, VB, which may be provided to a mixer 260 and used for performing a phase interpolation, may be maintained within a desired amplitude range. For example, the voltage control signals VA, VB may be less than the desired maximum magnitude Vmax and may be greater than the desired minimum magnitude Vmin of the amplitude controller 230.

Referring again to FIG. 2, the mixer 260 may receive (e.g., selectively receive) I, Q, IB and QB clocks having a phase of 0 degrees, 90 degrees, 180 degrees and 270 degrees, respectively, according to the phase location of the output clock 280. The mixer 280 may perform a phase interpolation of the output clock 280 by applying weight values to the voltage control signals VA, VB to the received clocks I, Q, IB and/or QB. The phase-interpolated output clock 280 may be fed back to the phase detector 210.

FIG. 3 is a phase diagram illustrating a conventional relationship between voltage control signals VA, VB and a phase of a current output clock.

Referring to FIG. 3, the quadrant controller 220 may receive the voltage control signals Vref, VA, and VB to determine a phase location of the output clock 280. For example, the quadrant controller 220 may compare the voltage control signals VA and VB with the reference voltage signal Vref to determine the phase quadrant location of a phase of the output clock 280. The quadrant controller 220 may map the $PD_{up}$ and $PD_{dn}$ signals to $A_{up}$, $A_{dn}$, $B_{up}$ and $B_{dn}$ of the amplitude controller 230 based on the phase location of the output clock 280.

When the first voltage control signal VA is greater than the reference voltage signal Vref, a phase of the output clock 280 may be located in either the first or fourth quadrant. In this example, the $PD_{up}$ may be mapped to $B_{up}$, and the $PD_{dn}$ may be mapped to $B_{dn}$ in order to apply a weight value to Q clock having a phase of 90 degrees and a QB clock having a phase of 270 degrees.

Alternatively, when the first voltage control signal VA is less than the reference voltage signal Vref, a phase of the output clock 280 may be located in either the second or third quadrant. In this example, the $PD_{up}$ signal may be mapped to the $B_{dn}$ signal, and the $PD_{dn}$ signal may be mapped to the $B_{up}$ signal. This may result in an increase in the second voltage control signal VB in order to map the phases of the output clock 280 to that of the serial input data 205.

In another example, when the second voltage control signal VB is greater than the reference voltage signal Vref, a phase of the output clock 280 may be located in either the first or second quadrant. In this example, the PDup may be mapped the to and signal, and the $PD_{dn}$ signal may be mapped to the $A_{up}$ signal.

Alternatively, when the second voltage control signal VB is less than the reference voltage signal Vref, a phase of the output clock 280 may be located in either the third or fourth quadrant. In this example, the $PD_{up}$ signal may be mapped to the $A_{up}$ signal, and the $PD_{dn}$ signal may be mapped to the $A_{dn}$ signal.

This may result in the decrease of the first voltage control signal VA in order to delay the output clock 280, for example, when the output clock 280 leads the serial input data 205.

The amplitude controller 230 may receive the voltage Vmax (e.g., a maximum Vmax) and the voltage Vmin (e.g., minimum Vmin) to determine whether the voltage control signals VA, VB may be maintained within a voltage range. When the first or second voltage control signal VA or VB is greater than the voltage Vmax, the up components of the in-phase and quadrature phase control signals $I_{up}$, $Q_{up}$ may be set to zero in order to suppress (e.g., prevent) the first or second voltage control signal VA or VB from exceeding the voltage Vmax. In this case, the down components of the in-phase and quadrature phase control signals $I_{dn}$ and $Q_{dn}$ may be set equal to the down components of the first and second control signals $A_{dn}$ and $B_{dn}$, respectively.

Alternatively, when the first or second voltage control signal VA or VB is less than the voltage Vmin, the up components of the in-phase and quadrature phase control signals $I_{up}$ and $Q_{up}$ may be set equal to the up components of the first and second control signals $A_{up}$ and $B_{up}$, respectively. In this case, the down components of the in-phase and quadrature phase control signals $I_{dn}$ and $Q_{dn}$ may be set to zero in order to suppress (e.g., prevent) the first or second voltage control signal VA or VB from decreasing less than the voltage Vmin.

The amplitude controller 230 may suppress (e.g., prevent) the first and second voltage control signals VA and VB from surpassing the range.

The charge pump circuit 240 may receive the in-phase control signals $I_{up}$, $I_{dn}$ and the charge pump circuit 250 may receive the quadrature phase control signals $Q_{up}$, $Q_{dn}$ in order to increase or decrease the voltage control signals VA, VB based on $I_{up}$, $I_{dn}$, $Q_{up}$, and $Q_{dn}$ and may provide the voltage control signals VA, VB to the mixer 260.

The mixer 260 may perform phase interpolations on four kinds of clocks I, Q, IB, QB using the voltage control signals VA, VB to generate the phase-interpolated output clock 280.

SUMMARY OF THE INVENTION

Example embodiments of the present invention provide recovery circuits, and methods for the same, which may reduce deterioration of jitter characteristics, increase data transmission speed, allow for initial states of voltage control signals to be maintained, for example, continuously, and/or include a phase interpolator, which may be controlled by a single charge pump circuit.

A recovery circuit, according to an example embodiment of the present invention, may include a phase detector, a quadrant decision unit, a quadrant controller, a charge pump unit, and a phase interpolator. The phase detector may compare a phase of input data with a phase of a current output clock to generate first up signal and first down signal, and the quadrant decision unit may determine a phase location for the current output clock and output quadrant decision signals based on the phase location. The quadrant controller may output a second up signal and a second down signal based on the first up signal and the first down signal and the quadrant decision signals, and the charge pump unit may output a first and second phase control voltage based on the second up signal and the second down signal. The phase interpolator may select clocks from a plurality of clocks based on the quadrant decision signals and output an output clock signal based on the selected clocks.

Another example embodiment of the present invention provides a signal recovery method. The signal recovery method, according to an example embodiment of the present invention, may include generating a plurality of clocks, having a phase delay of about 90 degrees with respect to each other, comparing a phase of input data with a phase of a current output clock to generate first up signal and first down signal, determining a phase location of the current output clock to output quadrant decision signals, receiving the first up signal, the first down signal and the quadrant decision signals to output second up signal and second down signal, outputting a first phase control voltage and a complimentary second phase control voltage based on the second up signal and the second down signal, the first phase control voltage and the second phase control voltage being increased or decreased based on the second up signal and the second down signal, and selecting clocks from the plurality of clocks based on the quadrant decision signals to generate an output clock.

Another example embodiment of the present invention provides a phase interpolator for use in a recovery circuit. A phase interpolator, according to an example embodiment of the present invention, may select at least two clocks from a plurality of clocks, multiply the selected clocks with a first and second phase control voltages to generate a first and a second result, respectively, and add the first and second results to generate an output clock. Each of the plurality of clocks may have a phase delay of about 90 degrees with respect to each other.

In example embodiments of the present invention, each of the plurality of clock signals may have a phase delay of about 90 degrees with respect to one another.

In example embodiments of the present invention, the first phase control voltage and the second phase control voltage may be increased or decreased based on the second up signal and the second down signal.

In example embodiments of the present invention, the phase detector may generate the first up signal and first down signal based on a phase difference between the input data and the current output clock.

In example embodiments of the present invention, the phase interpolator may multiply the selected two clocks with the first and second phase control voltages to generate a first and a second result, respectively, and may add the first and second results to generate the output clock. Each of the plurality of clocks may have a phase delay of about 90 degrees with respect to each other.

In example embodiments of the present invention, the output clock of the phase interpolator may be fed back to the phase detector.

In example embodiments of the present invention, the phase detector may generate the first up signal having a first logic level and the first down signal having a second logic level when a phase of the current output clock leads a phase of the input data, and may generate the first up signal having the second logic level and the first down signal having the first logic level when the phase of the current output clock lags behind the phase of the input data.

In example embodiments of the present invention, the phase detector may include at least one flip-flop.

In example embodiments of the present invention, the quadrant decision unit may determine the phase location of the current output clock based on the first and the second phase control voltages, a first voltage corresponding to a voltage difference between the first and second phase control voltages, and a second voltage corresponding to a second voltage difference between the first and second phase control voltages.

In example embodiments of the present invention, the quadrant decision unit may determine the phase location of the current output clock based on the fed back current output clock signal, and whether a voltage difference between the first and second phase control voltage may be equal to the first voltage or the second voltage.

In example embodiments of the present invention, the quadrant controller may generate the second up signal and the second down signal based on the first up signal, the first down signal, and the quadrant decision signals.

In example embodiments of the present invention, the quadrant controller may map the first up signal to the second up signal and the first down signal to the second down signal when a phase of the current output clock is located in a first or third quadrant, and may map the first up signal to the second down signal and the first down signal to the second up signal if a phase of the current output clock is located in a second or fourth quadrant.

In example embodiments of the present invention, the charge pump unit may increase the first phase control voltage and decrease the second phase control voltage when the second up signal has a first logic level, and may decrease the first phase control voltage and increase the second phase control voltage when the second down signal has the first logic level.

In example embodiments of the present invention, the recovery circuit may further include a gm cell, which may receive the first phase control voltage and the second phase control voltage to output a third phase control voltage and a fourth phase control voltage, and the phase interpolator may select the clock signals from the plurality of clock signals based on the third phase control voltage and a fourth phase control voltage.

In example embodiments of the present invention, the phase interpolator may multiply the selected clock signals with the first and second phase control voltages, respectively, to generate a first and second result, add the first and second result to generate an output clock, a pth clock signal within the plurality of clock signals having a phase delay of about p*360/m degrees with respect to a first clock signal within the plurality of clock signals, p being a natural number greater than two, and m being a natural number greater than 4.

In example embodiments of the present invention, the phase decision unit may determine a range in which the phase of the current output clock belongs based on the first and the second phase control voltages, a first voltage corresponding to a first voltage difference between the first and second phase control voltages, and a second voltage corresponding to a second voltage difference between the first and second phase control voltages.

In example embodiments of the present invention, the phase decision unit may determine the range in which the phase of the current output clock belongs based on the current output clock, output from the phase interpolator, and whether a voltage difference between the first and second phase control voltage may be equal to the first voltage or the second voltage.

In example embodiments of the present invention, the phase controller may generate the second up signal and the second down signal based on the first up signal and the first down signal and the phase decision signals.

In example embodiments of the present invention, the plurality of clocks may include a first clock and a pth clock, the pth clock having a phase delay of about p*360/m degrees with respect to the first clock, p being a natural number between two and m, and m being a natural number greater than four, and the selected clocks may have a phase difference of 360/m degrees with respect to each other.

In example embodiments of the present invention, the plurality of clock signals may include at least a first, second, third, and fourth clock signal, and the phase interpolator may further include a first clock selection circuit, which may receive the first and second clocks and select one of the first and second clocks as one of the selected clocks, and a second clock selection circuit, which may receive the third and fourth clocks and select one of the third and fourth clocks as another one of the selected clocks.

BRIEF DESCRIPTION OF THE DRAWINGS

Example embodiments of the present invention will become more apparent by describing in detail example embodiments of the present invention as disclosed herein with reference to the accompanying drawings, in which:

FIG. 7 is a table used for updating quadrant states in a quadrant decision unit, according to another example embodiment of the present invention;

Figure 1:
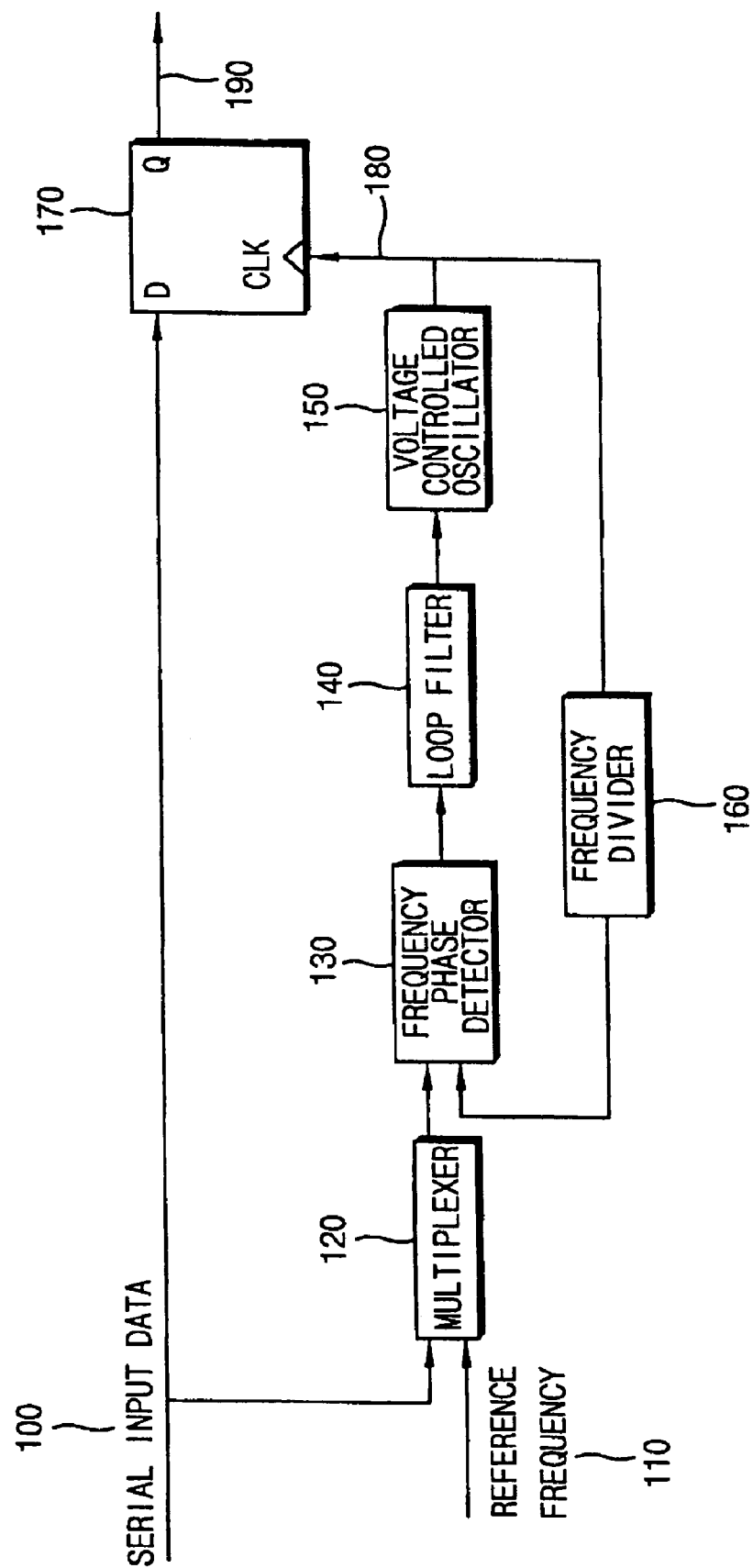
FIG. 1 is a block diagram illustrating a conventional clock and data recovery circuit using a phase locked loop PLL.

DETAILED DESCRIPTION OF EXAMPLE
EMBODIMENTS OF THE PRESENT
INVENTION

Example embodiments of the present invention are disclosed herein. However, structural and functional details disclosed herein are representative for purposes of describing example embodiments of the present invention. Example embodiments of the present invention may, however, be embodied in many alternate forms and should not be construed as limited to the example embodiments set forth herein.

While example embodiments of the present invention may be modified and/or altered in a variety of different ways, example embodiments are shown in the drawings and will be described in detail herein. It should be understood, however, that example embodiments of the present invention are not limited to the forms disclosed herein, but instead, the example embodiments of the present invention covers all modifications, equivalents, and alternatives falling within the spirit and scope of the present invention and/or example embodiments thereof. Like numbers refer to like elements throughout the description of the figures.

Although example embodiments of the present invention will be discussed herein with regard to an order of functions, functions associated with example embodiments of the present invention may occur in any suitable order. For example, two blocks shown in succession may in fact be executed concurrently, substantially concurrently, simultaneously, or substantially simultaneously, and/or the functions may be executed in a reverse order, depending on the functions.

Figure 4:
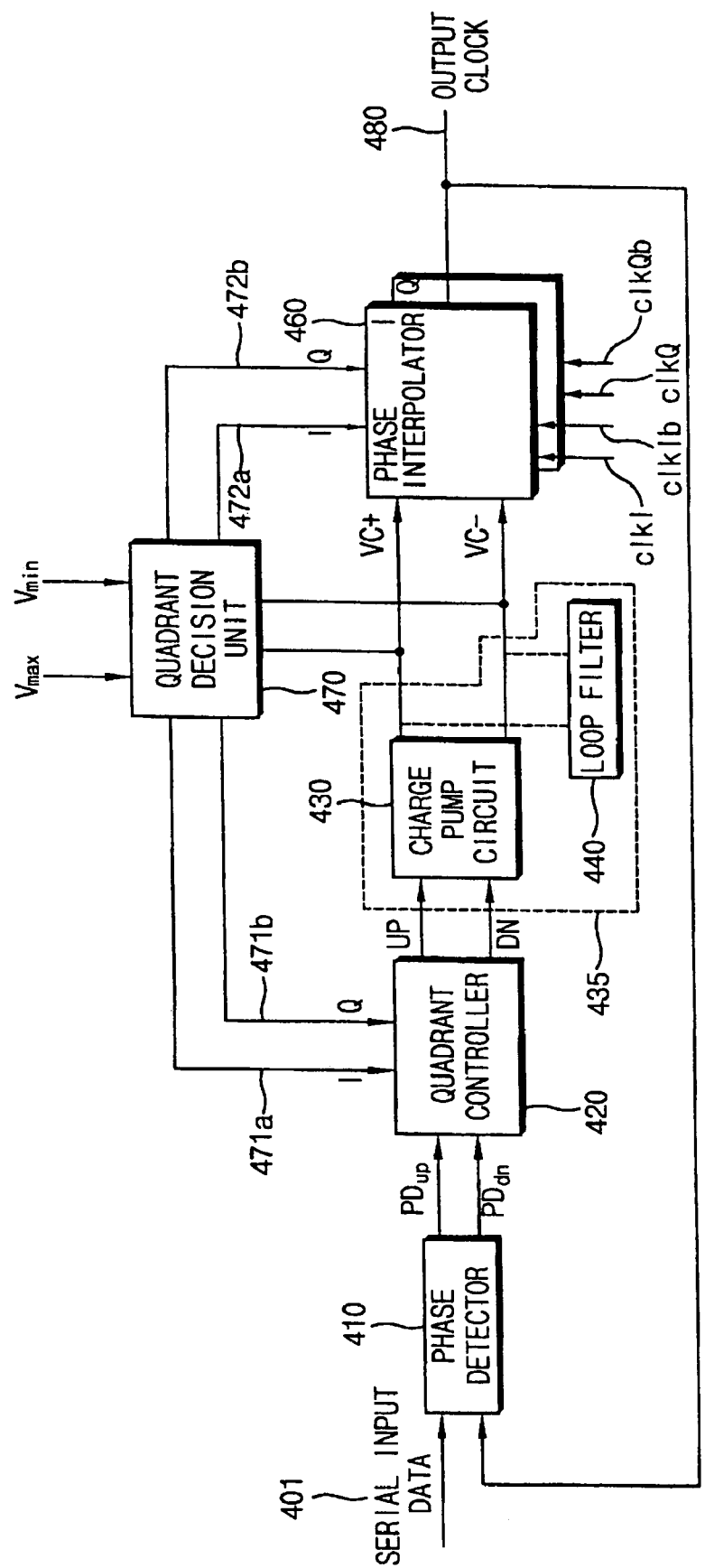
FIG. 4 is a block diagram illustrating a recovery circuit, according to an example embodiment of the present invention.

FIG. 4 is a block diagram illustrating a recovery circuit (e.g., a clock and/or data recovery circuit), according to an example embodiment of the present invention. Referring to FIG. 4, a phase detector 410 may compare a phase of input data (e.g., serial input data) 401 with a phase of an output clock 480, and may generate phase difference signals $PD_{up}$ and $PD_{dn}$ based on the phase comparison. For example, when the phase of the output clock 480 leads the phase of the serial input data 401, the phase detector 410 may generate a $PD_{up}$ (e.g., a first up signal) having a high logic level and a $PD_{dn}$ (e.g., a first down signal) having a low logic level. In another example, when a phase of the output clock 480 lags behind a phase of the serial input data 401, the phase detector 410 may generate a $PD_{up}$ signal having a low logic level and a $PD_{dn}$ signal having a high logic level. The phase detector 410 shown in FIG. 4 may perform similar, or substantially similar, functions to that of the phase detector 210 shown in FIG. 2.

A quadrant controller 420 may output a second up signal UP and a second down signal DN for controlling a charge pump circuit 430, for example, based on the phase difference signals $PD_{up}$ and $PD_{dn}$. For example, the quadrant controller 420 may determine a phase location for the current output clock 480 using I and Q quadrant decision signals 471a and 471b, respectively, output from a quadrant decision unit 470. In example embodiments of the present invention, I and Q signals 471a and 471b may control a phase of the output clock 480.

For example, when both of the I and Q signals 471a and 471b have a high logic level, a phase of the output clock 480 may be located in a first quadrant. When the I signal 471a has a low logic level and the Q signal 471b has a high logic level, a phase of the output clock 480 may be located in a second quadrant. When both of the I and Q signals 471a and 471b have a low logic level, a phase of the output clock 480 may be located in a third quadrant. When the I signal 471a has a high logic level and the Q signal 471b has a low logic level, a phase of the output clock 480 may be located in a fourth quadrant.

I and Q quadrant decision signals 472a and 472b, respectively, which may be input to a phase interpolator (e.g., an analog phase interpolator) 460, may be the same, or substantially the same, as the above-described quadrant decision signals 471a and 471b.

Operations of the quadrant decision unit 470, according to an example embodiment of the present invention, will be described in more detail below.

The quadrant controller 420 may map the $PD_{up}$ and $PD_{dn}$ signals to the second up signal UP and second down signal DN, which may be used for controlling the charge pump circuit 430 (within the charge pump unit 435), for example, in response to the I and Q signals 471a and 471b. In example embodiments of the present invention, the charge pump unit 435 may include the charge pump circuit 430 and a loop filter 440.

Phase control voltages VC+ and VC−, which may be provided to the phase interpolator 460, may be controlled according to the phase location of a phase of the current output clock 480 (e.g., in which quadrant a phase of the current output clock 480 may be located). Based on the phase location of the current output clock 480, a mapping relationship between the output signals $PD_{up}$ and $PD_{dn}$ of the phase detector 410, and the input signals UP and DN of the charge pump circuit 430 may be, for example, as follows.

When a phase of the current output clock 480 is located in the first quadrant, (e.g., having phase range between about 0 to about 90 degrees), the $PD_{up}$ signal of the phase detector 410 may be mapped to the UP signal provided to the charge pump circuit 430, and the $PD_{dn}$ signal of the phase detector 410 may be mapped to the DN signal provided to the charge pump circuit 430. When a phase of the current output clock 480 is located in the third quadrant, (e.g., having a phase range between about 180 to about 270 degrees), the mapping relationships may be the same, or substantially the same, as when a phase of the current output clock 480 may be located in the first quadrant.

When a phase of the current output clock 480 is located in the second quadrant (e.g., having a phase range between about 90 to about 180 degrees) and/or the fourth quadrant (e.g., having a phase range between about 270 to about 360 degrees), the $PD_{up}$ signal of the phase detector 410 may be mapped to the DN signal and the $PD_{dn}$ signal of the phase detector 410 may be mapped to the UP signal. The charge pump circuit 430 may output the phase control voltages VC+ and VC− based on the UP and DN signals output from the quadrant controller 420.

In example embodiments of the present invention, the charge pump circuit 430 may be a differential charge pump circuit, and may control phase control voltages VC+ and VC−, for example, based on the output signals UP and DN from the quadrant controller 420. For example, when the UP signal is applied to the charge pump circuit 430, the first phase control voltage VC+ may increase and the second phase control voltage VC− may decrease. In another example, when the DN signal is applied to the charge pump circuit 430, the first phase control voltage VC+ may decrease and the second phase control voltage VC− may increase. The output voltages VC+ and VC− and weight values may be applied to the two clocks I and Q 472a and 472b, respectively, and phase interpolation of the output clock 480 may be performed.

The second phase control voltage VC− may be changed from a higher (e.g., maximum) value to a lower (e.g., minimum) value, for example, while the first phase control voltage VC+ changes from a lower (e.g., minimum) value to a higher (e.g., maximum) value. In another example, the second phase control voltage VC− may be changed from a lower (e.g., minimum) value to a higher (e.g., maximum) value while the fist phase control voltage VC+ changes from a higher (e.g., maximum) value to a lower (e.g., minimum) value.

The phase interpolator 460 may receive a plurality of clocks (e.g., four) clkI, clkQ, clkIb, clkQb having a phase of about 0 degrees, about 90 degrees, about 180 degrees, and about 270 degrees, respectively, and may select two clocks based on the phase location of the phase of the current output clock 480.

The phase interpolator 460 may use the I and Q signals, 472a and 472b provided from the quadrant decision unit 470, in order to cover a 360-degree phase range. In this example, a phase of the output clock 480 may be in the phase range of between about 0 to about 90 degrees, which may serve as a phase difference between the I and Q clocks (e.g., 471a and 472b, and 472a and 472b).

In example embodiments of the present invention, the phase control voltages VC+ and VC− may be directly, or indirectly, input to the phase interpolator 460.

In another example, the phase control voltages VC+ and VC− may be input to the phase interpolator 460, for example, via a gm cell.

Figure 5:
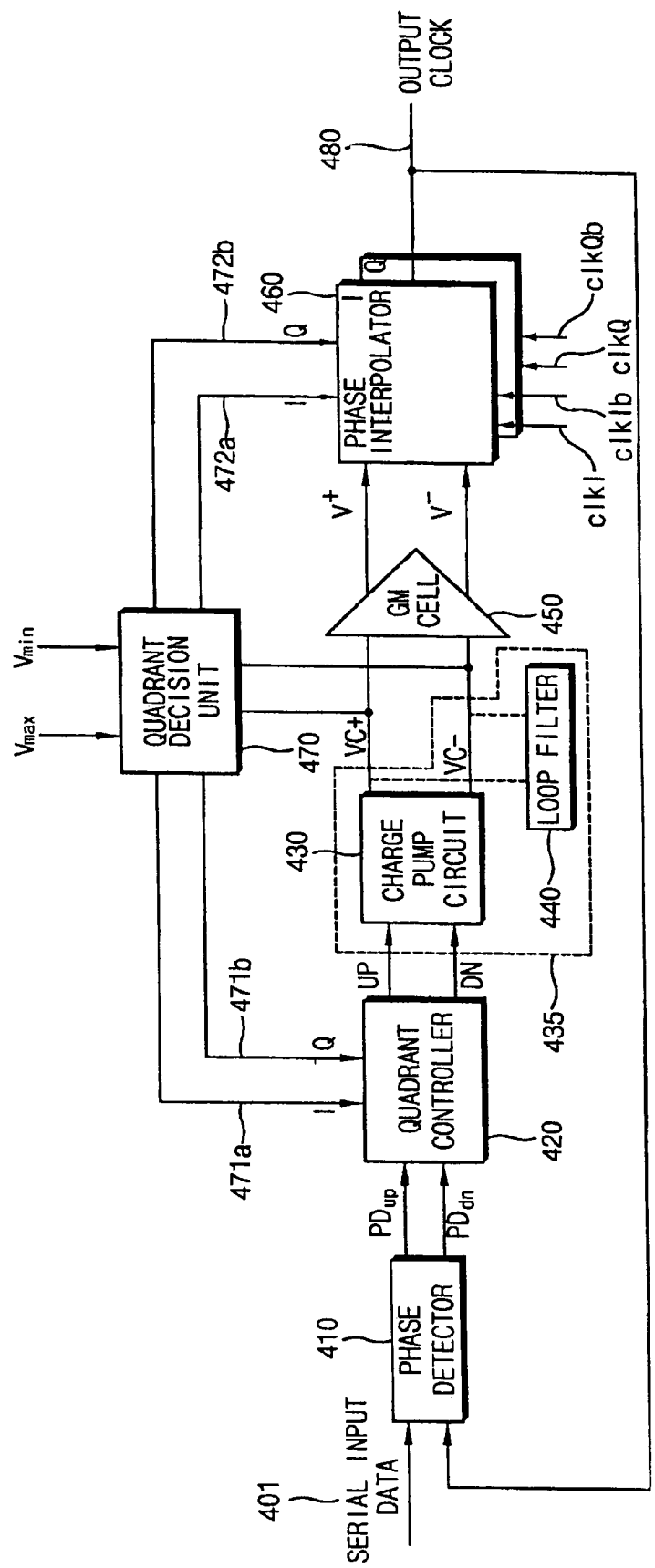
FIG. 5 is a block diagram illustrating a recovery circuit including a gm cell, according to another example embodiment of the present invention.

FIG. 5 is a block diagram illustrating a recovery circuit (e.g., a clock and/or data recovery circuit) including a gm cell, according to another example embodiment of the present invention.

Referring to FIG. 5, the output voltages VC+ and VC− of the charge pump circuit 430 shown in FIG. 4 or the output voltages V+ and V− output from the charge pump circuit 430 via the gm cell 450 (e.g., as shown in FIG. 5), may be applied as weight values to, for example, two of the signals I and Q composed of, for example, in-phase clock signals clkI, clkIb and quadrature phase clock signals clkQ, clkQb, respectively.

In example embodiments of the present invention, the output clock 480 may be generated (or regenerated) using a phase interpolation of the output clock 480, and the output clock 480 may be re-input to the phase detector 410 forming a feedback loop.

Figure 6:
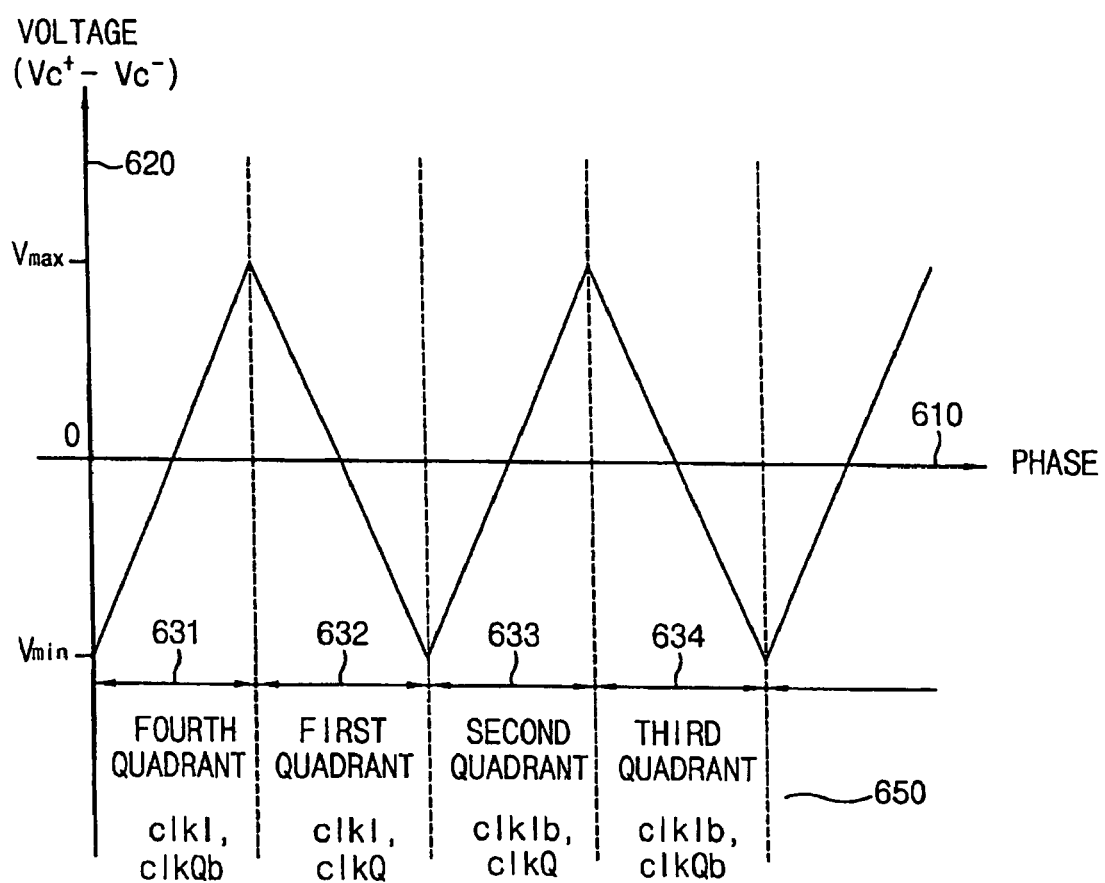
FIG. 6 is a phase diagram illustrating relationships between an output voltage of a differential charge pump circuit and a phase of a current output clock, according to another example embodiment of the present invention.

FIG. 6 is a phase diagram illustrating example relationships between an output voltage of a charge pump circuit (e.g., a differential charge pump circuit) and a phase of a current output clock, according to an example embodiment of the present invention. Referring to FIG. 6, a horizontal axis 610 may represent a phase of an output clock and a vertical axis 620 may represent a voltage difference between the phase control voltages VC+ and VC− of the differential charge pump circuit 430.

As illustrated in FIG. 6, a first quadrant 632, a second quadrant 633, a third quadrant 634, and a fourth quadrant 631 may denote four quadrants in which the phase of the output clock 480 may be located.

Reference numeral 650 denotes two signals I and Q, which may be selected corresponding to each of the plurality of quadrants (e.g., four) 631, 632, 633, 634. Reference numeral 631 may represent the fourth quadrant where the phase of the output clock 480 may be located, and the in-phase clock signal clkI having a phase of about 0 degrees and the quadrature phase clock signal clkQb having a phase of about 270 degrees may be selected, for example, when the voltage difference between the phase control voltages VC+ and VC− corresponds to the fourth quadrant.

Reference numeral 632 may represent the first quadrant in which the phase of the output clock 480 may be located, and the in-phase clock signal clkI having a phase of about 0 degrees and the quadrature phase clock signal clkQ having a phase of about 90 degrees may be selected, for example, when the voltage difference between the phase control voltages VC+ and VC− corresponds to the first quadrant.

Reference numeral 633 may represent the second quadrant in which the phase of the output clock 480 may be located, and the in-phase clock signal clkIb having a phase of about 180 degrees and the quadrature phase clock signal clkQ having a phase of about 90 degrees may be selected, for example, when the voltage difference between the phase control voltages VC+ and VC− corresponds to the second quadrant.

The reference numeral 634 may represent the third quadrant in which the phase of the output clock 480 may be located, the in-phase clock signal clkIb having a phase of 180 degrees and the quadrature phase clock signal clkQb having a phase of 270 degrees may be selected, for example, when the voltage difference between the phase control voltages VC+ and VC− corresponds to the third quadrant.

Figure 3:
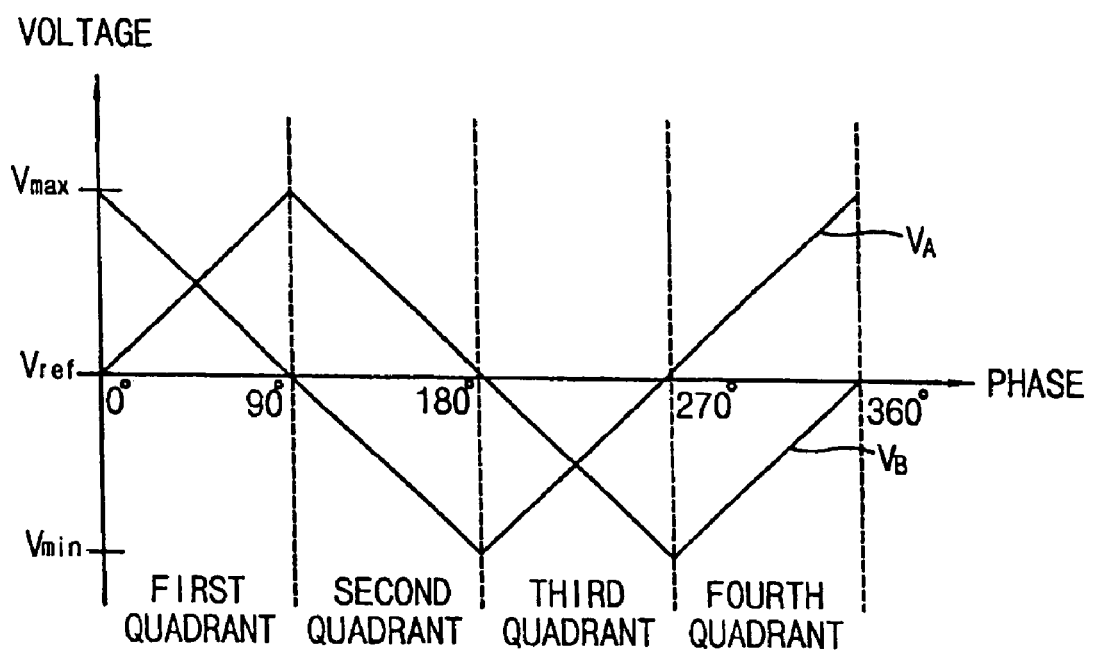
FIG. 3 is a phase diagram illustrating a conventional relationship between voltage control signals VA, VB and a phase of a current output clock.

In the conventional method for determining a phase region (or location) of the current output clock shown as in FIG. 3, a phase location of the current output clock was determined by comparing the voltages VA and VB of each of the charge pump circuits 240, 250 with the reference voltage Vref. As shown in FIG. 3, a phase location of the current output clock may be determined using the difference in the relationships of the voltage signals VA and VB output from each of the charge pump circuits 240, 250.

In a method for determining a phase location (or phase region) of the current output clock, according to an example embodiment of the present invention, as shown in FIG. 6, the voltage difference (e.g., VC+−VC−) of the first quadrant may be identical, or substantially identical, as the voltage difference (e.g., VC+−VC−) of the fourth quadrant, and the voltage difference (e.g., VC+−VC−) of the second quadrant may be identical, or substantially identical, to the voltage difference (e.g., VC+−VC−) of the third quadrant, and the phase location of the current output clock may not be based on the relationship between the phase control voltages of the differential charge pump circuit 430.

The recovery circuit, according to example embodiments of the present invention, may use both information regarding the phase location of the current output clock (e.g., which quadrant the phase of the current output clock is located), and a voltage difference (e.g., VC+−VC−) in order to determine the phase location of the current output clock.

For example, the phase location of the current output clock may be determined using the I and Q signals (e.g., 471a and 471b, and/or 472a and 742b) output from the quadrant decision unit 470.

For example, phase location information of the current output clock may be updated based on the I and Q (e.g., 471a and 471b, and/or 472a and 742b) signals having phase location information regarding the phase of the current output clock and based on whether the voltage difference (e.g., VC+−VC−) reaches boundaries between the higher (e.g., maximum) voltage value $V_{max}$ and the lower (e.g., minimum) voltage value $V_{min}$.

FIG. 7 is an example table, which may be used for updating quadrant states in a quadrant decision unit (e.g., quadrant decision unit 470). The quadrant decision unit 470 may maintain phase location information for a current output clock via the I and Q signals (e.g., 471a and 471b, and/or 472a and 742b), and if a voltage difference between the output voltages VC+ and VC− of the differential charge pump circuit 470 reaches the $V_{max}$ or $V_{min}$, the state of the I and Q signals (e.g., 471a and 471b, and/or 472a and 742b) may be updated, for example, when phase location information regarding the output clock may be changed, based on the example phase diagram shown in FIG. 6.

Referring to FIG. 7, 'H' may denote an active state of the I and Q signals (e.g., 471a and 471b, and/or 472a and 742b) and 'L' may denotes an inactive state of the I and Q signals.

Although example embodiments of the present invention have been discussed with respect to specific signal states, the signal states may be various in other example embodiments of the present invention.

In an example of the quadrant decision table shown in FIG. 7, when the phase of the output clock 480 is located in the first quadrant, both of the I and Q (e.g., 471a and 471b, and/or 472a and 742b) signals may be in the active state 'H'.

If a voltage difference between the phase control voltages VC+ and VC− of the differential charge pump circuit 470 reaches $V_{max}$ while the I and Q signals (e.g., 471a and 471b, and/or 472a and 742b) are in the active state 'H', the phase location of the output clock 480 may change from the first quadrant to the fourth quadrant and the I and Q signals (e.g., 471a and 471b, and/or 472a and 742b) may be changed to the active state 'H' and the inactive state 'L', respectively.

If a voltage difference between the phase control voltages VC+ and VC− of the differential charge pump circuit 470 reaches $V_{min}$ while the I and Q signals (e.g., 471a and 471b, and/or 472a and 742b) are in the active state, the phase location of the output clock 480 may change from the first quadrant to the second quadrant, and the I and Q signals (e.g., 471a and 471b, and/or 472a and 742b) may be changed to the inactive state 'L' and the active state 'H', respectively.

The quadrant decision unit 470 may output the I and Q signals (e.g., 471a and 471b, and/or 472a and 742b) based on, for example, the example table shown in FIG. 7, which may be associated with the phase interpolator 460, and may output I and Q signals (e.g., 471a and 471b, and/or 472a and 742b.

In example embodiments of the present invention, the I and Q signals 472a and 472b provided to the phase interpolator 460 may be used for selecting a plurality of clocks (e.g., two) from clocks clkI, clkQ, clkIb, clkQb, and I and Q signals 471a and 471b provided to the quadrant controller 420 may be used for mapping the output signals $PD_{up}$ and $PD_{dn}$ of the phase detector 410 to the input signals UP/DN of the charge pump circuit 430 based on the phase location of the current output clock 480.

Figure 2:
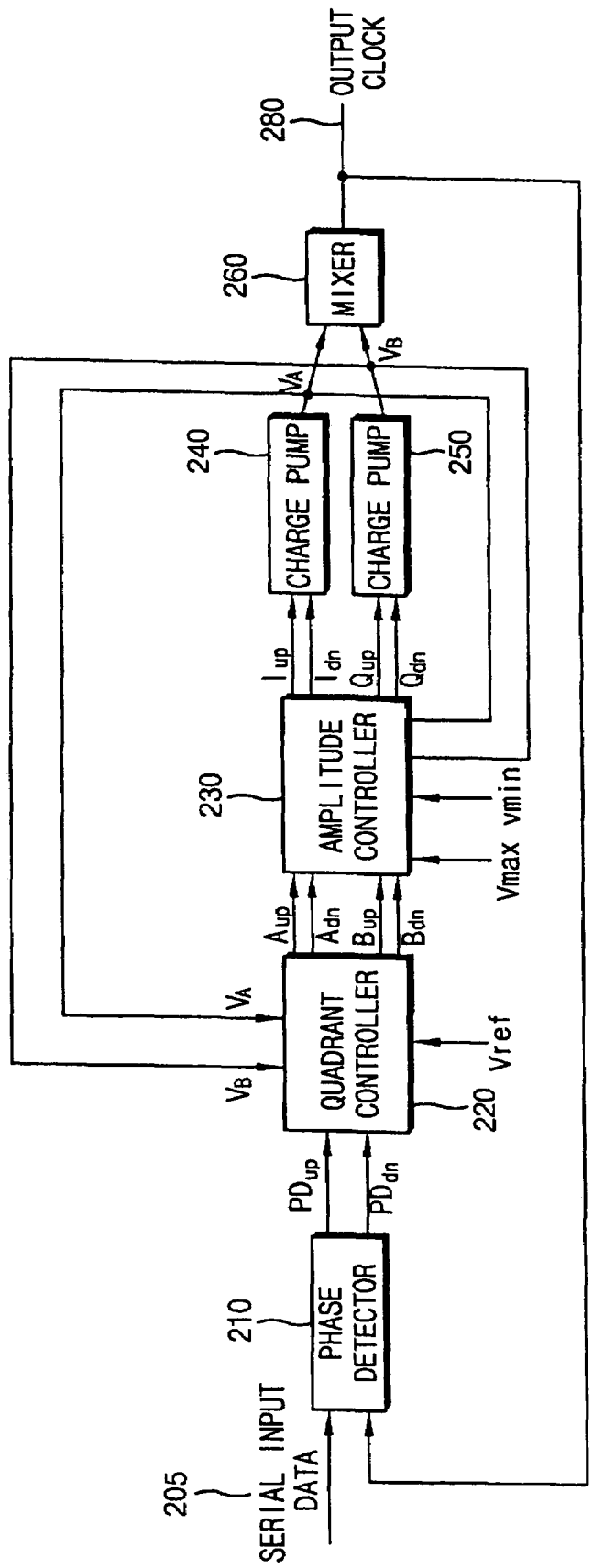
FIG. 2 is a block diagram illustrating a conventional clock recovery circuit employing an analog phase interpolator.

In example embodiments of the present invention, the amplitude controller 230 of FIG. 2, which may suppress output voltages VA and VB from surpassing $V_{min}$ and $V_{max}$ need not be included.

In example embodiments of the present invention, the quadrant decision unit 470 may check (e.g., continuously check) whether the output voltages VC+ and VC− of the charge pump circuit 430 have reached $V_{max}$ or $V_{min}$. If the output voltages VC+ and VC− of the charge pump circuit 430 has reached $V_{max}$ or $V_{min}$, each state of the I and Q signals (e.g., 471a and 471b, and/or 472a and 742b) may be changed. This may maintain output voltages VC+ and VC− of the charge pump circuit 430 between $V_{max}$ and $V_{min}$.

Figure 8:
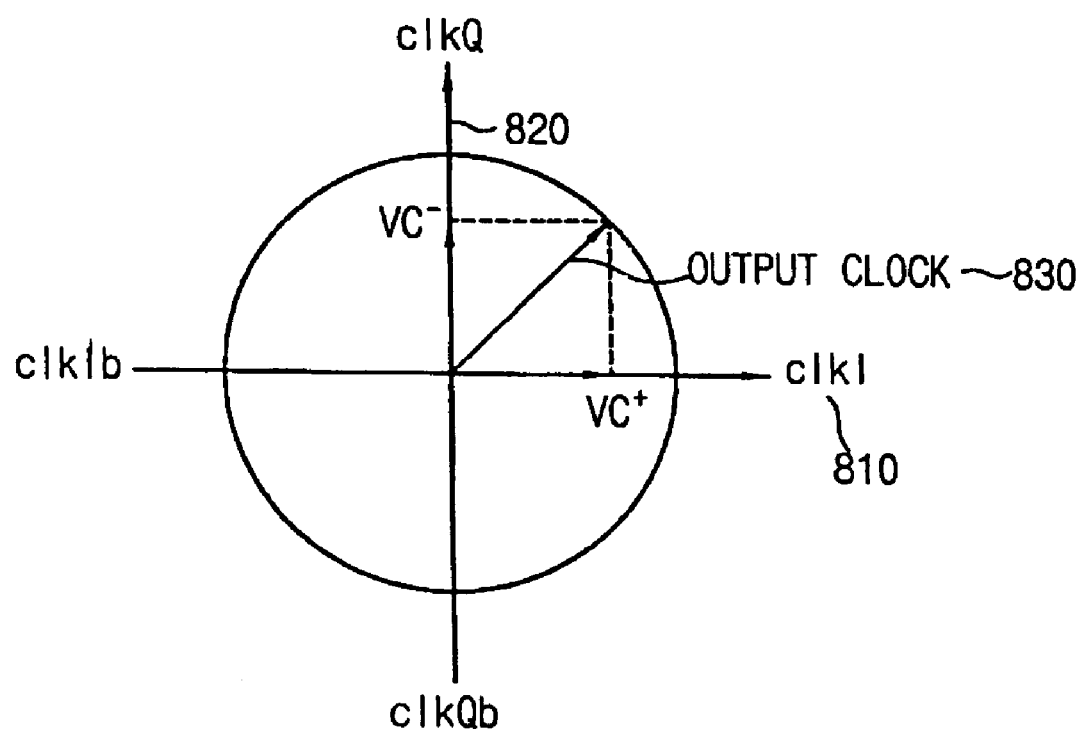
FIG. 8 is a graph illustrating relationships between voltage control signals VC+, VC− and a phase of a current output clock.

FIG. 8 is a graph illustrating an example relationship between voltage control signals VC+ and VC− and a phase of a current output clock 480. Referring to FIG. 8, an in-phase clock signal clkI 810 (e.g., having a phase of about 0 degrees), and a quadrature phase clock signal clkQ 820 (e.g., having a phase of about 90 degrees), may be phase-interpolated, and an output clock 830 (e.g., having a phase between about 0 degrees and about 90 degrees), may be generated.

The output clock 830 (e.g., having a phase between about 0 degrees and about 90 degrees) may be generated based on a plurality of phase control voltages (e.g., two phase control voltages) VC+ and VC−. In example embodiments of the present invention, VC− may have a complementary relationship with respect to VC+.

When the VC+ voltage decreases (e.g., to a minimum voltage) and the VC− voltage increases (e.g., to a maximum voltage), a phase of the output clock 830 may become about 90 degrees. When the VC+ voltage increases (e.g., to a maximum voltage) and the VC− voltage decreases (e.g., to a minimum voltage), a phase of the output clock 830 may become about 0 degrees. When both the VC+ and VC− signals become, for example, half of the magnitude of voltage $V_{max}$ and the voltage $V_{min}$, a phase of the output clock 830 may become about 45 degrees.

In an example embodiment of the present invention, (e.g., FIG. 5), the output clock 830 (e.g., having a phase between about 0 and about 90 degrees), may be generated based on a plurality of output voltages (e.g., two output voltages) V+ and V−. In example embodiments of the present invention (e.g., as illustrated in FIG. 5), the output voltage V− may have a complementary relationship with respect to V+.

Figure 9:
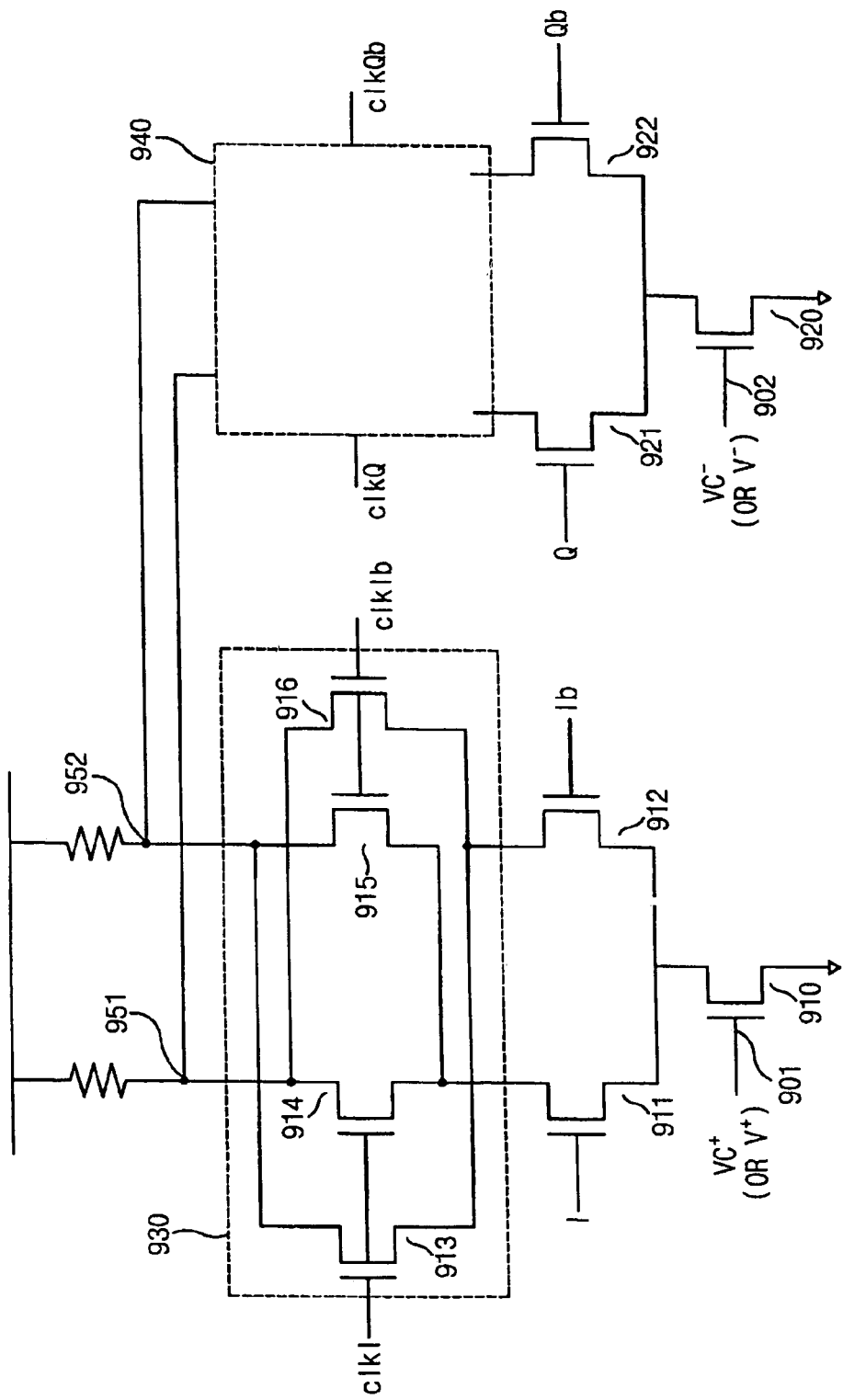
FIG. 9 is a circuit diagram illustrating a phase interpolator, according to another example embodiment of the present invention.

FIG. 9 is a circuit diagram illustrating a phase interpolator (e.g., an analog phase interpolator), according to another example embodiment of the present invention.

Referring to FIG. 9, an I clock mixer 930 and a Q clock mixer 940, which may have the same, or substantially the same, configuration are illustrated.

A shown in FIG. 9, a first clock select signal I, used for selecting clkI clock, may be input to a transistor 911, and a second clock select signal Ib, which may be used for selecting clkIb clock that has a phase of about 180 degrees with respect to the phase of the clkI clock, may be input to a transistor 912. A phase control voltage VC+ of the charge pump circuit 430 or an output voltage V+ output from the gm cell 450 may be input to a transistor 910, and the VC+ or V+ voltage signal may be used for controlling a weight value applied to the I clocks. For example, a voltage level of VC+ or V+ may control the degree at which the transistor 910 may be controlled in order to control the quantity of a current provided.

As shown in FIG. 9, both transistors 913 and 914 receive the clock signal clkI, and both of the transistors 915 and 916 receive the clock signal clkIb. The I clock mixer 930 may output a first result to the first node 951 and the second node 952, and the weight value based on the voltage VC+ or V+ may be applied to the clock signal clkI or clkIb. The Q clock mixer 940 may output a second result to the first node 951 and the second node 952, and the weight value based on the voltage VC− or V− may be applied to the clock signal clkQ or clkQb.

The first result output from the I clock mixer 930 and the second result output from the Q clock mixer 940 may be added, and the sum may be output as a phase-interpolated clock.

For example, if an active I signal is input to the transistor 911, an inactive Ib signal is input to the transistor 912, the transistor 911 may be turned-on and the transistor 912 may be turned-off, and a current may flow through the transistor 914, 915, 911, and 910. In this example, transistors 914 and 915 may be controlled by the clock signals clkI and clkIb, respectively, and the transistor 910 may apply (e.g., differentially apply) a weight value to a voltage level of the first output node 951 and a voltage level of the second output node 952.

In another example, if an active Ib signal is input to the transistor 912, an inactive I signal is input to the transistor 911, the transistor 912 may be turned-on and the transistor 911 may be turned-off, and a current may flow through transistors 913, 916, 912, and 910. In this example, the transistors 913 and 916 may be controlled by the clock signals clkI and clkIb, respectively, and the transistor 910 may apply (e.g., differentially apply) a weight value to a voltage level of the first output node 951 and a voltage level of the second output node 952.

In example embodiments of the present invention, the recovery circuits and methods for the same may utilize any suitable phase interpolation technique, for example, a phase of 360 degrees may be divided into six, eight, or any suitable number of equal, or substantially equal, sections in which the phase of the output clock may be located. For example, if phase of 360 degree is divided into six equal, or substantially equal, sections having a phase difference of about 60 degrees with respect to one another. In this example, the six-divided phase clocks may include a first clock having a reference phase of about 0 degrees, a second clock having a delayed phase of about 60 degrees with respect to the first clock, a third clock having a delayed phase of about 120 degrees with respect to the first clock, a fourth clock having a delayed phase of about 180 degrees with respect to the first clock, a fifth clock having a delayed phase of about 240 degrees with respect to the first clock and a sixth clock having a delayed phase of about 300 degrees with respect to the first clock.

In this example, two clocks may be selected from the six clocks, for example, based on the phase location information for a current output clock. The selected two clocks may be multiplied with first and second phase control voltage (e.g., VC+ and VC− or V+ and V−, or combinations thereof), respectively, and the products may be added together to generate an output clock.

Figure 10:
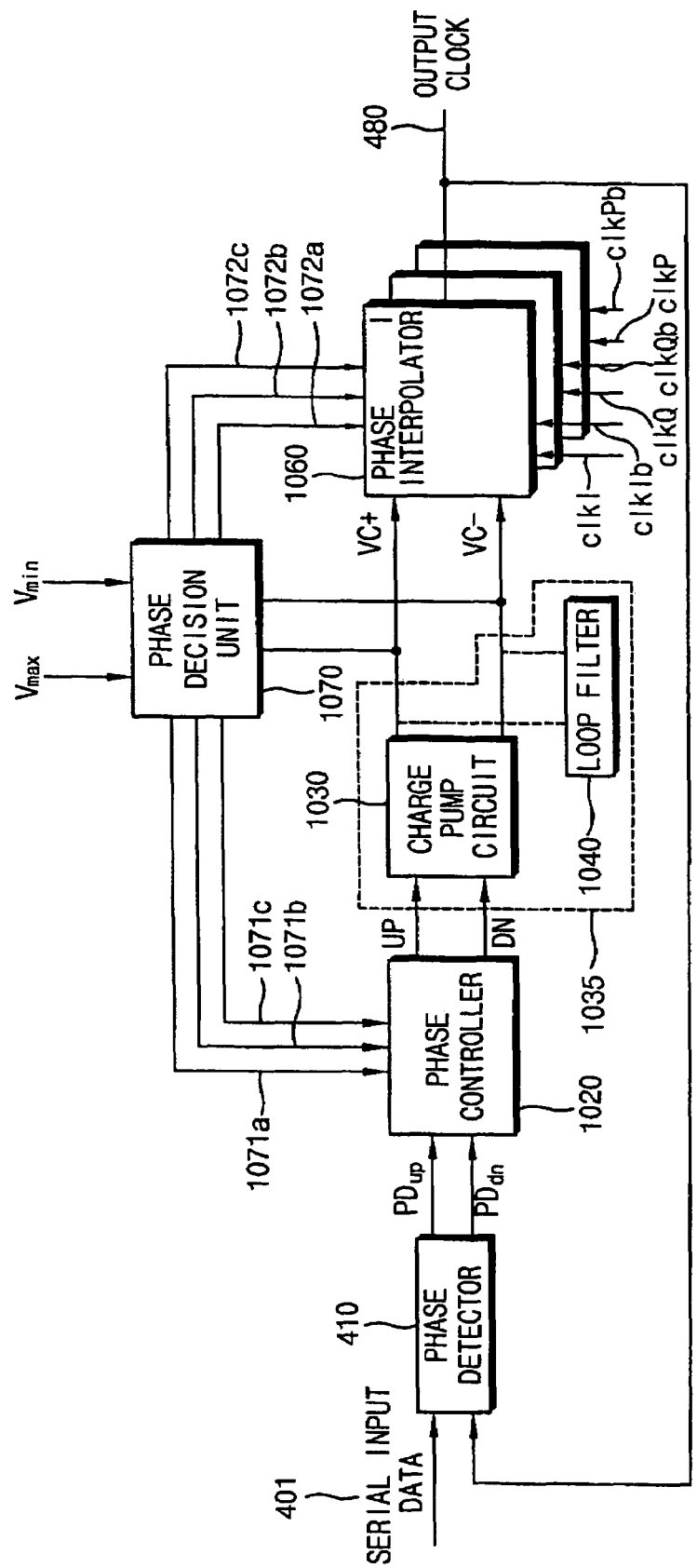
FIG. 10 is a block diagram illustrating a recovery circuit, according to another example embodiment of the present invention.

FIG. 10 is a block diagram illustrating a recovery circuit (e.g., a clock and/or data recovery circuit), according to another example embodiment of the present invention.

The example embodiment of the present invention as shown in FIG. 10 may perform phase-interpolation on the basis of, for example, six sections. In FIG. 10, a phase controller 1020 may be the same, or substantially the same, as the quadrant controller 420, and a phase decision unit 1070 may be the same, or substantially the same, as the quadrant decision unit 470. A charge pump unit 1035 may include a charge pump circuit 1030 and a loop filter 1040 and may be the same, or substantially the same, as the charge pump unit 435.

Referring to FIG. 10, six clocks clkI, clkIb, clkQ, clkQb, clkP, clkPb, having a phase difference of about 60 degrees with respect to each other, may be input to an phase interpolator (e.g., analog phase interpolator) 1060.

The phase decision unit 1070 may output groups (e.g., two groups) of select signals 1071a, 1071b, 1071c and 1072a, 1072b, 1072c. In example embodiments of the present invention, the recovery circuit (of FIG. 10) may operate in a manner similar, or substantially similar, as the recovery circuit described above with regard to FIGS. 4 and 5; however, the recovery circuit of FIG. 10 may use, for example, six phases.

Example embodiments of the present invention have been described with regard to, for example, FIGS. 4, 5, 9, and/or 10. However, it will be understood that the specific aspects and/or characteristics illustrated in each of FIGS. 4, 5, 9, and/or 10, may be interchanged between example embodiments of the present invention, as described herein.

In example embodiments of the present invention, the gm cell 450 may provide increased flexibility in circuit design and/or chip design due to, for example, a lower (e.g., relatively lower) operating current and/or a smaller (e.g., relatively smaller) operating current variation.

Example embodiments of the present invention have been described with regard to high and low logic signals. However, it will be understood that any suitable logic signal may be used, for example, a high 'H' logic signal, a low 'L' logic signal, a logic '1' or '0', and/or suitable voltage levels (e.g., +5V, −5V, etc.).

Example embodiments of the present invention may provide a recovery circuit with improved jitter characteristic, for example, by controlling an analog phase interpolator using one charge pump circuit.

While example embodiments of the present invention have been described in detail, it should be understood that various changes, substitutions and alterations may be made herein without departing from the scope of the present invention.

What is claimed is:

1. A recovery circuit comprising:
   a phase detector configured to compare a phase of input data with a phase of a current output clock to generate a first up signal and a first down signal,
   a quadrant decision unit configured to determine a phase location for the current output clock and output quadrant decision signals based on a voltage difference between first and second phase control voltages,
   a quadrant controller configured to output a second up signal and a second down signal based on the first up signal and the first down signal and the quadrant decision signals,
   a charge pump unit configured to output the first and second phase control voltages based on the second up signal and the second down signal, and
   a phase interpolator configured to select clocks from a plurality of clocks based on the quadrant decision signals and output an output clock based on the selected clocks and the first and second phase control voltages.

2. The recovery circuit of claim 1, wherein each of the plurality of clocks has a phase delay of about 90 degrees with respect to one another.

3. The recovery circuit of claim 1, wherein the first phase control voltage and the second phase control voltage are increased or decreased based on the second up signal and the second down signal.

4. The recovery circuit of claim 1, wherein the phase detector generates the first up signal and the first down signal based on a phase difference between the input data and the current output clock.

5. The recovery circuit of claim 1, wherein the phase interpolator is further configured to multiply the selected two clocks with the first and second phase control voltages to generate a first and a second result, respectively, and configure to add the first and second results to generate the output clock, each of the plurality of clocks having a phase delay of about 90 degrees with respect to each other.

6. The recovery circuit of claim 1, wherein the output clock of the phase interpolator is fed back to the phase detector.

7. The recovery circuit of claim 3, wherein the phase detector generates the first up signal having a first logic level and the first down signal having a second logic level when a phase of the current output clock leads a phase of the input data, and generates the first up signal having the second logic level and the first down signal having the first logic level when the phase of the current output clock lags behind the phase of the input data.

8. The recovery circuit of claim 3, wherein the phase detector includes at least one flip-flop.

9. The recovery circuit of claim 1, wherein the quadrant decision unit determines a phase location of the current output clock based on the first and second phase control voltages, a first voltage difference between the first and second phase control voltages, and a a second voltage difference between the first and second phase control voltages.

10. The recovery circuit of claim 9, wherein the quadrant decision unit determines the phase location of the current output clock based on the fed back current output clock, and whether a voltage difference between the first and second phase control voltage is equal to the first voltage difference or the second voltage difference.

11. The recovery circuit of claim 1, wherein the quadrant controller generates the second up signal and the second down signal based on the first up signal, the first down signal, and the quadrant decision signals.

12. A recovery circuit comprising:
a phase detector configured to compare a phase of input data with a phase of a current output clock to generate a first up signal and a first down signal,
a quadrant decision unit configured to determine a phase location for the current output clock and output quadrant decision signals based on the phase location,
a quadrant controller configured to output a second up signal and a second down signal based on the first up signal and the first down signal and the quadrant decision signals,
a charge pump unit configured to output first and second phase control voltages based on the second up signal and the second down signal, and
a phase interpolator configured to select clocks from a plurality of clocks based on the quadrant decision signals and output an output clock based on the selected clocks, wherein
the quadrant controller maps the first up signal to the second up signal and the first down signal to the second down signal when a phase of the current output clock is located in a first or a third quadrant, and maps the first up signal to the second down signal and the first down signal to the second up signal if a phase of the current output clock is located in a second or a fourth quadrant.

13. A recovery circuit comprising:
a phase detector configured to compare a phase of input data with a phase of a current output clock to generate a first up signal and a first down signal,
a quadrant decision unit configured to determine a phase location for the current output clock and output quadrant decision signals based on the phase location,
a quadrant controller configured to output a second up signal and a second down signal based on the first up signal and the first down signal and the quadrant decision signals,
a charge pump unit configured to output first and second phase control voltages based on the second up signal and the second down signal, and
a phase interpolator configured to select clocks from a plurality of clocks based on the quadrant decision signals and output an output clock based on the selected clocks, wherein
the charge pump unit increases the first phase control voltage and decreases the second phase control voltage when the second up signal has a first logic level, and decrease the first phase control voltage and increase the second phase control voltage when the second down signal has the first logic level.

14. A recovery circuit comprising:
a phase detector configured to compare a phase of input data with a phase of a current output clock to generate a first up signal and a first down signal,
a quadrant decision unit configured to determine a phase location for the current output clock and output quadrant decision signals based on the phase location,
a quadrant controller configured to output a second up signal and a second down signal based on the first up signal and the first down signal and the quadrant decision signals,
a charge pump unit configured to output first and second phase control voltages based on the second up signal and the second down signal,
a phase interpolator configured to select clocks from a plurality of clocks based on the quadrant decision signals and output an output clock based on the selected clocks, and
a gm cell configured to receive the first phase control voltage and the second phase control voltage to output a third phase control voltage and a fourth phase control voltage, wherein
the phase interpolator selects the clocks from the plurality of clocks based on the third phase control voltage and the fourth phase control voltage.

15. The recovery circuit of claim 1, wherein the phase interpolator is configured to multiply the selected clocks with the first and second phase control voltages, respectively, to generate first and second results, add the first and second results to generate the output clock, a pth clock signal within the plurality of clocks having a phase delay of about $p*360/m$ degrees with respect to a first clock within the plurality of clocks, p being a natural number greater than two, and m being a natural number greater than 4.

16. The recovery circuit of claim 15, wherein the phase detector generates the first up signal and the first down signal based on a phase difference between the input data and the current output clock.

17. The recovery circuit of claim 15, wherein the quadrant decision unit determines a range in which the phase of the current output clock belongs based on the first and the second phase control voltages, a first voltage corresponding to a first voltage difference between the first and second phase control voltages, and a second voltage corresponding to a second voltage difference between the first and second phase control voltages.

18. The recovery circuit of claim 17, wherein the quadrant decision unit determines the range in which the phase of the current output clock belongs based on the current output clock, output from the phase interpolator, and whether a voltage difference between the first and second phase control voltages is equal to the first voltage or the second voltage.

19. The recovery circuit of claim 16, wherein the quadrant controller generates the second up signal and the second down signal based on the first up signal and the first down signal and the phase decision signals.

20. A recovery circuit comprising:
a phase detector configured to compare a phase of input data with a phase of a current output clock to generate a first up signal and a first down signal,
a quadrant decision unit configured to determine a phase location for the current output clock and output quadrant decision signals based on the phase location, a quadrant controller configured to output a second up signal and a second down signal based on the first up signal and the first down signal and the quadrant decision signals, a charge pump unit configured to output first and second phase control voltages based on the second up signal and the second down signal, and a phase interpolator configured to select clocks from a plurality of clocks based on the quadrant decision signals and output an output clock based on the selected clocks, wherein the phase interpolator is configured to multiply the selected clocks with the first and second phase control voltages, respectively, to generate first and second results, add the first and second result to generate the output clock, a pth clock signal within the plurality of clocks having a phase delay of about p*360/m degrees with respect to a first clock within the plurality of clocks, p being a natural number greater than two, and m being a natural number greater than 4, the phase detector generates the first up signal and the first down signal based on a phase difference between the input data and the current output clock, and the charge pump unit increases the first phase control voltage and decreases the second phase control voltage when the second up signal has a first logic level, and decreases the first phase control voltage and increase the second phase control voltage when the second down signal has the first logic level.

21. A signal recovery method comprising:

generating a plurality of clocks, having a phase delay of about 90 degrees with respect to each other;

comparing a phase of input data with a phase of a current output clock to generate a first up signal and a first down signal;

determining a phase location of the current output clock to output quadrant decision signals, the phase location of the current output clock being determined based on a voltage difference between first and second phase control voltages;

receiving the first up signal, the first down signal and the quadrant decision signals to output a second up signal and a second down signal;

outputting the first phase control voltage and the second phase control voltage based on the second up signal and the second down signal, the first phase control voltage and the second phase control voltage being increased or decreased based on the second up signal and the second down signal; and selecting clocks from the plurality of clocks based on the quadrant decision signals; and generating an output clock based on the selected clocks, the first phase control voltage and the second phase control voltage.

22. The method of claim 21, wherein the plurality of clocks includes a first clock and a pth clock, the pth clock having a phase delay of about p*360/m degrees with respect to the first clock, p being a natural number between two and m, and m being a natural number greater than four, and wherein the selected clocks have a phase difference of 360/m degrees with respect to each other.

23. A phase interpolator for use in a recovery circuit, the phase interpolator comprising:

a clock selection circuit configured to select at least two clocks from a plurality of clocks based on a plurality of quadrant decision signals, the plurality of quadrant decision signals being generated based on a voltage difference between first and second phase control voltages; and a mixing circuit configured to multiply the selected clocks with the first and second phase control voltages to generate first and second results, respectively, and add the first and second results to generate an output clock; wherein each of the plurality of clocks has a phase delay of about 90 degrees with respect to each other.

24. The phase interpolator of claim 23, wherein the plurality of clocks include at least a first, a second, a third, and a fourth clock, and the clock selection circuit further includes, a first clock selection circuit adapted to receive the first and second clocks and select one of the first and second clocks as one of the selected clocks based on a first of the plurality of quadrant decision signals, and a second clock selection circuit adapted to receive the third and fourth clocks and select one of the third and fourth clocks as another one of the selected clocks based on a second of the plurality of quadrant decision signals.

25. A recovery circuit including the phase interpolator of claim 23.

26. A recovery circuit for performing the recovery method of claim 21.

27. The recovery circuit of claim 1, wherein the phase interpolator includes, a clock selection circuit configured to select at least two clocks from the plurality of clocks based on the quadrant decision signals, and a mixing circuit configured to multiply the selected clocks with the first and second phase control voltages to generate first and second results, respectively, the mixing circuit being further configured to add the first and second results to generate the output clock, wherein each of the plurality of clocks has a phase delay of about 90 degrees with respect to each other.

28. The recovery circuit of claim 27, wherein the plurality of clocks include at least a first, a second, a third, and a fourth clock, and the clock selection circuit further includes, a first clock selection circuit configured to receive the first and second clocks and select one of the first and second clocks as one of the selected clocks based on a first of the quadrant decision signals, and a second clock selection circuit configured to receive the third and fourth clocks and select one of the third and fourth clocks as another one of the selected clocks based on a second of the quadrant decision signals.

29. The recovery circuit of claim 1, wherein the quadrant decision unit determines the phase location of the current output clock based on whether the voltage difference reaches a maximum or minimum value.

* * * * *